July 21, 1964 H. ROBERTS 3,142,025
ASTABLE TO BISTABLE MULTIVIBRATOR CONTROL CIRCUIT
Filed March 1, 1961
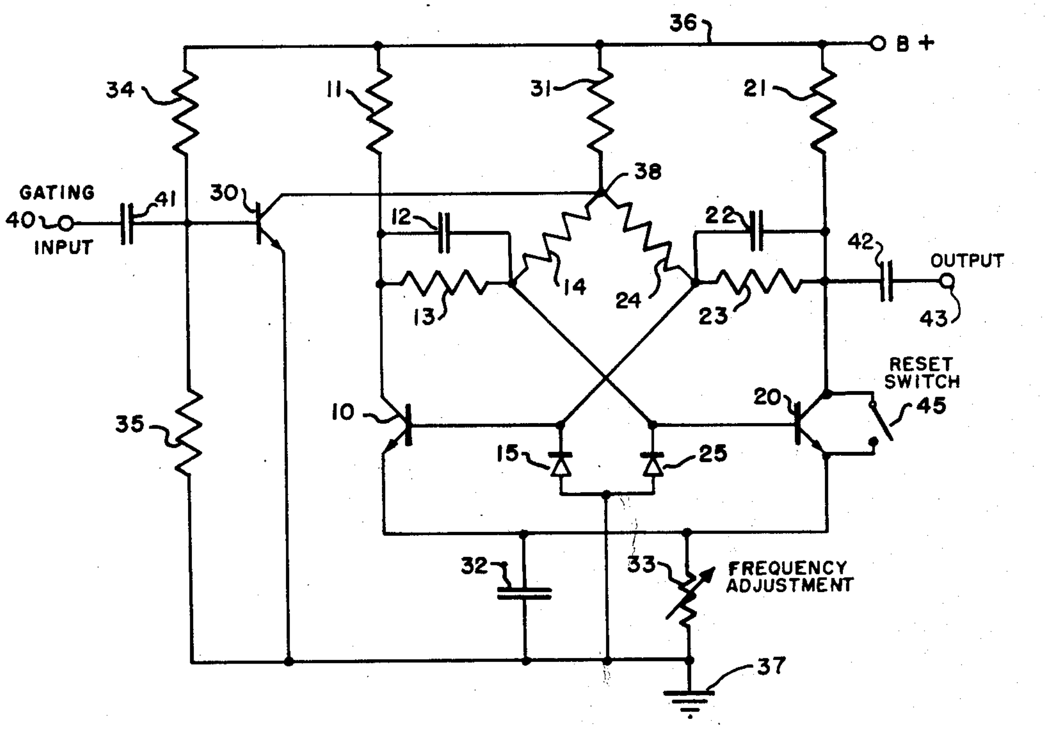
*INVENTOR,*
HENRY ROBERTS.
*BY* Harry M. Saragovitz
*ATTORNEY.*

United States Patent Office 3,142,025

Patented July 21, 1964

3,142,025

ASTABLE TO BISTABLE MULTIVIBRATOR CONTROL CIRCUIT

Henry Roberts, Fair Lawn, N.J., assignor to the United States of America as represented by the Secretary of the Army Filed Mar. 1, 1961, Ser. No. 92,722
2 Claims. (Cl. 331—113)

This invention relates to counting circuits and particularly to counting circuits for the conversion of analog information to digital information. More particularly, this invention relates to gated oscillators or multivibrators that can be started or stopped for counting purposes.

One well known type of counter is a modification of the standard Hartley oscillator. This has one oscillator stage, and one gating stage to start and stop the functioning of the oscillator. The switching of the Hartley oscillator is accomplished by rapidly changing the bias to the grid of the amplifier tube in the oscillator stage, which starts or stops the flow of current to the tank circuit, which in turn, starts or stops the oscillations that are being counted. This forms a pulsed oscillator that can be controlled by the application of a voltage from an input switch.

This type of counting oscillator starts quickly, but must, inevitibly, have a slow amplitude rise characteristic. It cannot be shut off instantaneously because of the inertia of the tank circuit which continues to produce oscillations while the amplitude of the oscillations are decaying.

Some of these difficulties can be overcome by the use of multivibrators, that have no tank circuits and, therefore, no ringing effect after the circuit is turned off.

Multivibrators are well known and are very extensively used in many forms of electronic circuitry. Multivibrators fall into the category of fast waveform generators that are designed to be switched between two voltage levels or conditions, and that may have two stable states, one stable state, or no stable state. The circuit that has two stable states is bistable; the circuit that has one stable state is monostable; and the circuit that has no stable state is astable.

All three types of circuits may be actuated or triggered by an external signal or pulse supply. In the bistable state, an external pulse may be used to change from one stable state to the other and so on. In the monostable state, an external pulse may be used to switch the circuit from one state to the other state, but the circuit always returns, after a prescribed interval, to the original stable state. In the astable state, with the circuit constantly switching from one state to the other at regular intervals, external pulses may be used to synchronize the switching of the circuit to some function of the timing of the pulses from the external supply.

If a multivibrator is to be used for counting, it must be of an astable or free-running type and means must be provided to connect or disconnect the output of the free-running multivibrator to the utilization circuit, or to start or stop the multivibrator with a minimum of error in timing. If a given interval of time is to be compared with the number of cycles of a known frequency or switching events that occur during the same interval, the problem is to have the counting unit start at the precise instant that the interval begins and the stops as nearly as possible at the precise instant that the interval ends.

It is therefore an object of this invention to provide an improved analog to digital converter.

It is a further object of this invention to provide an improved counting means for a given interval of time.

It is a further object of this invention is provide an improved method for turning on and off a multivibrator.

It is a further object of this invention to provide an improved multivibrator that can be started in a particular phase and stopped in either phase.

These and other objects are accomplished by providing a short circuiting means in the charging circuits of an astable multivibrator to reduce one of the supply potentials of the time-constant charging circuits to the point where it can no longer raise the potential of either of the triggering electrodes enough to switch the multivibrator to the opposite state. The multivibrator, in this case, is transistorized and the short circuiting means is also a transistor which is controlled through a gating voltage input.

This circuit will be more fully described, and other and further objects of this invention will become apparent in the following specification and the drawing which shows the circuit diagram of a typical embodiment of this invention.

In this typical embodiment of the invention transistors 10 and 20 and the other elements associated therewith comprise a symmetrical multivibrator circuit. The resistances 11 and 21 connect the collector electrodes of the respective transistors to the source of positive voltage 36. The emitter electrodes are connected together and through variable resistance 33 to the ground potential point 37. The symmetrical cross coupling in the multivibrator is accomplished through the resistances 13 and 23 and the condensers 12 and 22 between the collectors of the respective transistors and the base electrodes of the opposite transistors.

The resistors 14 and 24 connect the respective base electrodes of the transistors to a common control point 38, which connects directly to the collector of a control transistor 30 and through another load resistance 31 to the source of positive voltage 36.

The diodes 15 and 25 connect the respective base electrodes to the ground potential point 37 and act to absorb any voltage surge that might be harmful to the multivibrator transistors.

The operation of a multivibrator of this configuration is quite well known and need not be described here other than to point out that the resistor-condenser combinations 12, 13 and 14, and 22, 23 and 24 provide the primary control of the frequency of the transistor multivibrator. Additional frequency control is provided through the combination of the condenser 32 and the variable resistance 33.

In this circuit the potential of the control point 38 is established by the fixed resistances and the value of the voltage supply, but it is controllable by varying the resistance of the control transistor 30. This transistor has its collector connected directly to the control point 38 and its emitter connected directly to the ground potential. The base electrode is connected to the junction of the series resistances 34 and 35, across the source of voltage, which establish the bias of the transistor 30 and hold it in a normally conducting state. When the transistor 30 is a conducting state, the control point 38 is effectively shorted to ground and the multivibrator is held in one of its bistable states.

When a negative control voltage is applied to the gating input 40, the transistor 30 is cut-off; the current through the transistor is reduced; the current through the resistance 31 is also reduced; and the voltage of the point 38 rises. This causes he potential of the base electrodes of the transistors 10 and 20 to rise as fast as the condensers 12 and 22 can be charged through the network of resistances. As soon as the potential of the base electrode of one of the transistors reaches a level higher than that of its emitter electrode, that transistor will conduct to lower the potential at its collector electrode and, simultaneously, lower the potential at the base electrode of the other transistor, driving it beyond cut-off through the action of the corresponding one of the coupling condensers 12 or 22.

This cut-off bias on the other transistor is maintained until the corresponding coupling condenser can leak off its negative charge and be recharged positively through the network of resistors, raising the base electrode of the other transistor above cut-off. As soon as this happens, the other transistor conducts again, and in turn, drives the potential of the base electrode of the one transistor below cut-off in the same way. This condition is held until the discharge and recharging of the appropriate condenser again repeats the process.

The multivibrator is now operating in an astable condition, which continues until the control transistor 30 is again turned on and the low impedance between the point 38 and ground again reduces the potential of the point 38 low enough to prevent the potential of the control electrode of the nonconducting transistor from rising sufficiently to cause it to conduct again. This terminates the astable operation of the multivibrator, and the counting operation.

The astable operation of the multivibrator and the counting can be resumed by the application of another negative pulse at the gating input 40. The counting will resume at the phase of the cycle at which it terminated, although the reset switch 45 may be closed, before the application of another input pulse, to restore the circuit to a uniform condition wherein the transistor 10 is cut-off and the transistor 20 is conducting at the beginning of the next counting interval.

The connection of such a multivibrator for counting or any other normal use is well known and need not be shown here since it does not effect the operation of this circuit. This circuit may be used in any of the normal applications of a multivibrator, and the corresponding method of connecting the multivibrator into the necessary utilization circuit would also be applicable here. A typical output connection would be through the condenser 42 to an output terminal 43.

The additional frequency adjustment 33 is provided in the common emitter circuits to control the charging times of both of the halves of the multivibrator, in combination with the condenser 32, in a well known manner. This variable resistance 33 can vary the frequency of the multivibrator over a limited range. More substantial changes in the frequency of the multivibrator can be made by changing the values of the other resistors 13, 14, 23 or 24, or the values of the condensers 12 and 22.

In this typical embodiment of this invention, the transistors 10, 20, and 30 may be of the type 2N167; the resistors 11 and 21 are 10,000 ohms; the resistors 13, 14, 23 and 24 are 100,000 ohms; the resistor 31 is 50,000 ohms; the resistor 33 is 2,000 ohms; the resistor 34 is 510,000 ohms; and the resistor 35 is 100,000 ohms. The condensers 12 and 22 are 200 micro-microfarads and the condensers 41 and 42 may be of the order of .1 microfarad. The diodes are of the 1N54A type and the voltage is 30 volts. This particular multivibrator oscillates at 50,000 cycles per second.

While typical embodiments of this invention have been shown and described herein, it is understood that other embodiments will be obvious to anyone skilled in the art and that such embodiments are within the scope of this invention and of the appended claims.

I claim:

1. A counting circuit comprising; a first, a second, and a third transistor, each having emitter, collector, and base electrodes; a first resistor having one end connected to the collector electrode of said first transistor; a second resistor having one end connected to the collector electrode of said second transistor; a first condenser connected in parallel with said first resistor; a second condenser connected in parallel with said second resistor; the other end of said first resistor connected to the base electrode of said second transistor; the other end of said second resistor connected to the base electrode of said first transistor; a third and a fourth resistor connected in series between the other ends of said first and second resistors; a fifth resistor connecting the collector electrode of said first transistor to a source of voltage; a sixth resistor connecting the collector electrode of said second transistor to said source of voltage; a seventh resistor connecting the junction of said third and fourth resistors to said source of voltage; an eighth resistor connecting the emitter electrodes of both transistors to ground; a ninth and a tenth resistor connected in series between said source of voltage and ground; the collector electrode of said third transistor connected to the junction of said third and fourth resistors; the base electrode of said third transistor connected to the junction of said ninth and tenth resistors; the emitter electrode of said third transistor connected to ground; a first diode having its cathode connected to the base electrode of the said first transistor and its anode connected to ground; a second diode having its cathode connected to the base electrode of the second transistor and its anode connected to ground; a third condenser connected in parallel with said eighth resistor; and a source of gating input signals for said counting interval connected to the base electrode of said third transistor.

2. In a counting circuit as in claim 1, a reset switch connected between the emitter and collector electrodes of said second transistor, and an output circuit connected to the collector electrode of said second transistor.

References Cited in the file of this patent

UNITED STATES PATENTS

| | | |
|---|---|---|
| 2,891,195 | Smyth | June 16, 1959 |
| 3,010,078 | Stefanov | Nov. 21, 1961 |